United States Patent
Huang et al.

(10) Patent No.: US 12,327,026 B2
(45) Date of Patent: Jun. 10, 2025

(54) MEMORY CONTROLLER, MEMORY DEVICE, MEMORY SYSTEM AND OPERATION METHOD THEREOF

(71) Applicant: Yangtze Memory Technologies Co., Ltd., Hubei (CN)

(72) Inventors: Zhen Huang, Hubei (CN); Kang Li, Hubei (CN); Zhe Zhang, Hubei (CN)

(73) Assignee: YANGTZE MEMORY TECHNOLOGIES CO., LTD., Hubei (CN)

( * ) Notice: Subject to any disclaimer, the term of this patent is extended or adjusted under 35 U.S.C. 154(b) by 157 days.

(21) Appl. No.: 18/148,859

(22) Filed: Dec. 30, 2022

(65) Prior Publication Data

US 2024/0168652 A1    May 23, 2024

(30) Foreign Application Priority Data

Nov. 18, 2022   (CN) .......................... 202211449836.0

(51) Int. Cl.
| | |
|---|---|
| *G11C 16/10* | (2006.01) |
| *G06F 3/06* | (2006.01) |
| *G11C 16/34* | (2006.01) |
| *G11C 16/04* | (2006.01) |

(52) U.S. Cl.
CPC .......... *G06F 3/0619* (2013.01); *G06F 3/0659* (2013.01); *G06F 3/0679* (2013.01); *G11C 16/10* (2013.01); *G11C 16/3418* (2013.01); *G11C 16/0483* (2013.01); *G11C 16/3468* (2013.01)

(58) Field of Classification Search
CPC .... G06F 3/0619; G06F 3/0659; G06F 3/0679; G06F 3/064; G06F 3/0661; G06F 3/0611; G06F 3/0604; G06F 3/0616; G06F 3/0638; G06F 3/0658; G06F 3/0688; G11C 16/10; G11C 16/3418; G11C 16/0483; G11C 16/3468; G11C 16/26; G11C 16/34
See application file for complete search history.

(56) References Cited

U.S. PATENT DOCUMENTS

| | | | |
|---|---|---|---|
| 2011/0222341 A1* | 9/2011 | Chou ...................... | G11C 16/12 365/185.18 |
| 2019/0095116 A1* | 3/2019 | Igahara ................. | G06F 3/0634 |
| 2021/0349662 A1* | 11/2021 | Helm .................... | G06F 3/0673 |

* cited by examiner

*Primary Examiner* — Huan Hoang
*Assistant Examiner* — Justin Bryce Heisterkamp
(74) *Attorney, Agent, or Firm* — HANLEY, FLIGHT & ZIMMERMAN, LLC

(57) ABSTRACT

Memory controllers, memory devices, memory systems and operation methods are provided. A memory controller is to: find, in input data, a binary code to be replaced corresponding to a preset programming level to be replaced, the input data is to be written into a memory cell; and substitute the binary code to be replaced in the input data with a replacement binary code corresponding to a preset replacement programming level, and generate a replacement identifier linking a memory address corresponding to the replacement binary code. The quantity of states is reduced by modifying a data encoding mode of the memory controller to help shorten programming duration of the memory device and reduce disturbance.

19 Claims, 8 Drawing Sheets

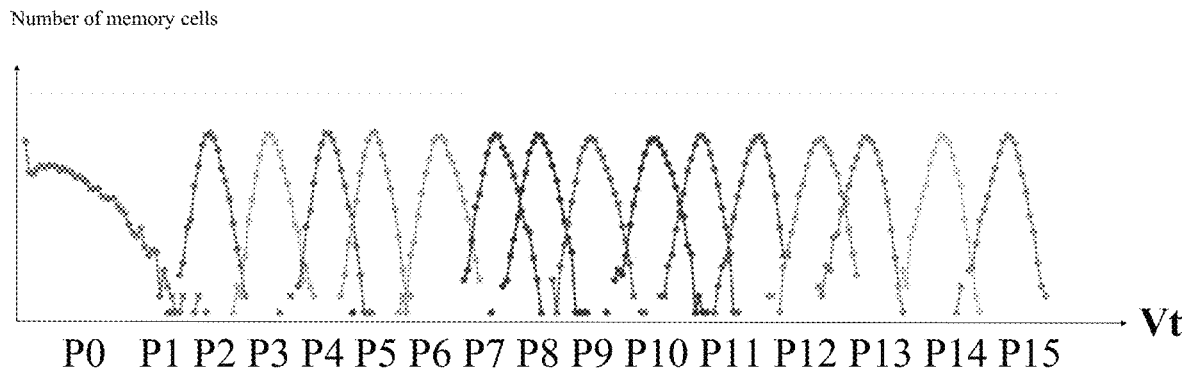

Fig. 10

Finding, in data to be stored, a binary code to be replaced corresponding to a preset programming level to be replaced, wherein the data to be stored is data to be written into the memory cell — S100

Substituting the binary code to be replaced in the data to be stored with a replacement binary code corresponding to a preset replacement programming level, and generating a location replacing identifier linking a storage address corresponding to the replacement binary code — S200

Fig. 11

MEMORY CONTROLLER, MEMORY DEVICE, MEMORY SYSTEM AND OPERATION METHOD THEREOF

RELATED APPLICATIONS

This application claims priority to and the benefit of Chinese Patent Application No. 202211449836.0, filed on Nov. 18, 2022, which is hereby incorporated by reference in its entirety.

TECHNICAL FIELD

The present patent relates to the field of semiconductor technologies, and more particularly to a memory controller, a memory device, a memory system and an operation method thereof.

BACKGROUND

Non-volatile memory devices have been widely used in electronic devices in various fields. A flash memory is one of the most widely used nonvolatile memory devices that can be electrically erased and reprogrammed, and may include memory devices with NOR and NAND architectures. A threshold voltage of each memory cell in the flash memory is changed to a required electrical level to implement various operations, such as reading, programming and erasing. When operating the flash memory, erasing operations may be executed based on block levels, programming operation may be executed based on page levels, and reading operations may be executed based on memory cell levels. The programming of a multi-state flash memory is implemented by identifying a plurality of different threshold voltage ranges.

Each memory cell stores more and more data as the capacity of the NAND Flash increases. The NAND Flash has evolved from an SLC (each cell may store one bit of information) and an MLC (each cell may store two bits of information) to a TLC (each cell may store three bits of information), and even a QLC (each cell may store four bits of information) and a PLC (each cell may store five bits of information). The memory controller will scatter host data at random using a random function generator and then store the scattered host data in the NAND Flash. However, when multi-bit storage is carried out, operations are often complicated.

BRIEF DESCRIPTION OF THE DRAWINGS

In order to describe the example technical solutions in the present patent more clearly, the following briefly introduces the accompanying drawings for describing the examples. The accompanying drawings in the following description show merely some example implementations of the present disclosure, and those of ordinary skill in the art may also derive other implementations and accompanying drawings from these accompanying drawings without creative efforts.

FIG. 10 shows a schematic diagram of an effect of sixteen threshold voltage distributions of a QLC that correspond to programming duration provided according to an example of the present disclosure;

FIG. 11 shows a schematic diagram of an example flowchart of an operation method of a memory controller provided by the present disclosure;

DETAILED DESCRIPTION

Figure 1:
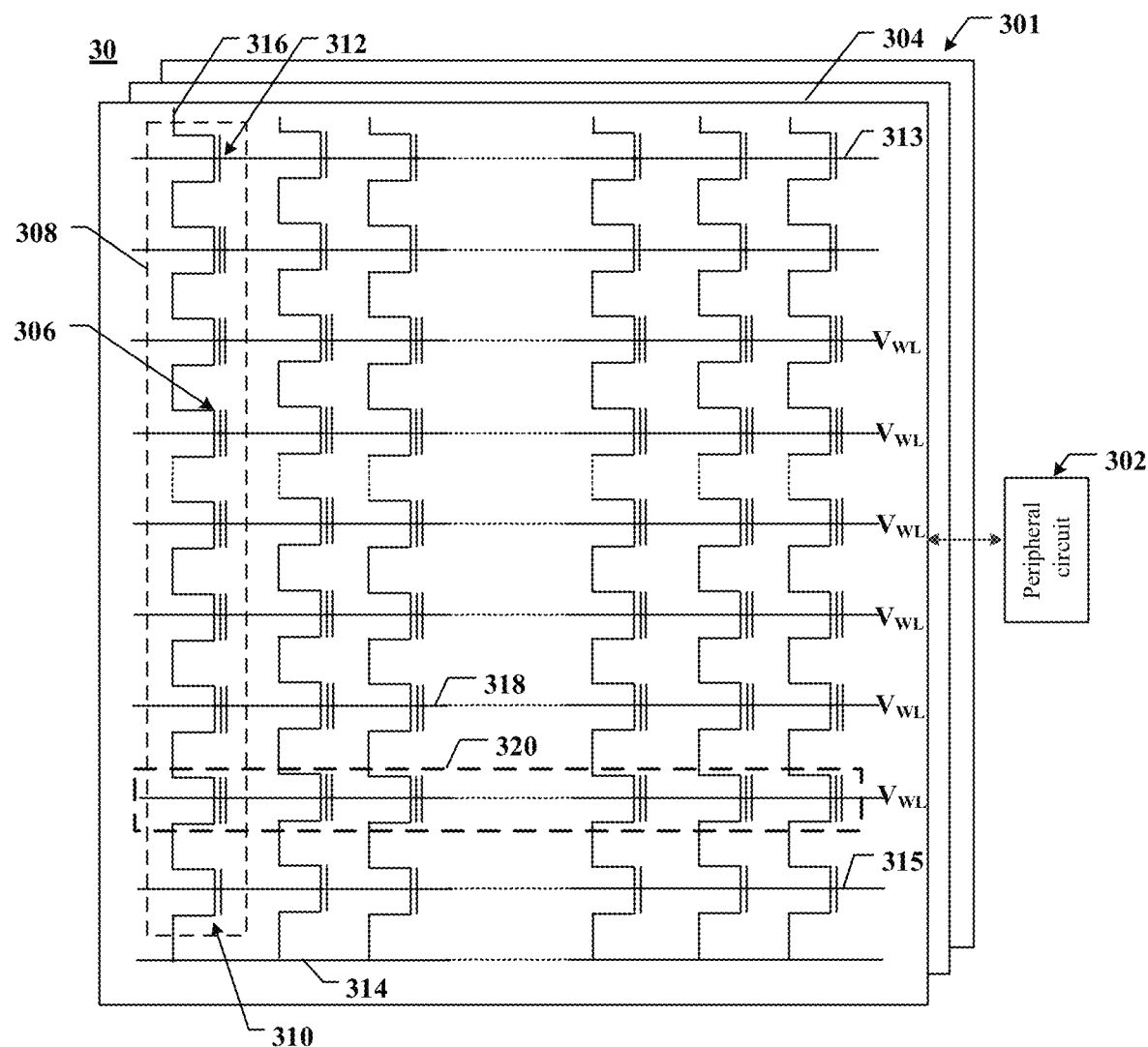
FIG. 1 shows a schematic circuit diagram of an example memory device according to some aspects of the present disclosure.

Technical solutions in some implementations of the present disclosure will be clearly and completely described below with reference to the accompanying drawings. The described examples are only part of the implementations of the present disclosure, but not all of them. Based on the implementations provided by the present disclosure, all other implementations obtained by those of ordinary skill in the art belong to the scope of protection of the present disclosure.

In the description of the present disclosure, it is to be understood that orientation or positional relationships indicated by the terms "center", "upper", "lower", "front", "back", "left", "right", "vertical", "horizontal", "top", "bottom", "inside" and "outside", etc. are orientation or positional relationships shown on the basis of the accompanying drawings, only for the purposes of the ease in describing the present disclosure and simplification of its descriptions, but not indicating or implying that a specified apparatus or element must be specifically located, and structured and/or operated in a specific orientation, and therefore, should not be understood as limitations to the present disclosure.

Unless the context requires otherwise, throughout the Description and Claims, the term "include" is interpreted as an open and inclusive meaning, that is, "including, but not limited to". In the description of the Description, the terms such as "one implementation", "some implementations", "exemplary implementations", "example", "example implementations", "exemplarily" or "some examples" are intended to indicate that a specific feature, structure, material or characteristic related to this implementation or example is included in at least one implementation or example of the present disclosure. The schematic representations of the above terms do not necessarily refer to the same implementation or example. In addition, the specific feature, structure, material or characteristic described may be included in any one or more implementations or examples in any suitable way.

Hereinafter, the terms "first" and "second" are only used for a descriptive purpose, and shall not be understood as indicating or implying relative importance or implicitly indicating the quantity of indicated technical features. Therefore, the features defined as "first" and "second" may include one or more of these features explicitly or implicitly. In the description of the implementations of the present disclosure, unless otherwise stated, "a plurality of" means two or more.

In describing some implementations, expressions of "coupled" and "connected" and their extensions may be used. For example, when some implementations are described, the term "connected" may be used to indicate that two or more components are in direct physical or electrical contact with each other. As another example, when describing some implementations, the term "coupled" may be used to indicate that two or more components have direct physical contact or electrical contact. However, the term "coupled" may also mean that two or more components are not in direct contact with each other, but still cooperate or interact with each other. The implementations disclosed herein are not necessarily limited to the contents herein.

The expression "at least one of A, B and C" has the same meaning as the expression "at least one of A, B or C", and these two expressions each include the following combinations of A, B and C: only A, only B, only C, a combination of A and B, a combination of A and C, a combination of B and C, and a combination of A, B and C.

"A and/or B" includes the following three combinations: only A, only B, and a combination of A and B.

The use of "applicable to" or "configured to" herein means open and inclusive language, which does not exclude devices applicable to or configured to perform additional tasks or steps.

In addition, the use of "based on" means openness and inclusiveness because a process, a step, calculation or other actions "based on" one or more of the said conditions or values may be based on additional conditions or exceed the said values in practice.

As used herein, the terms "about", "roughly" or "approximately" include a stated value and an average within an acceptable deviation range of a specific value. The acceptable deviation range is determined by those of ordinary skill in the art by taking into account the measurement being discussed and an error related to the measurement of a specific amount (i.e., the limitation of a measurement system) and/or manufacturing tolerances.

In the context of the present disclosure, the meanings of "on", "above" and "over" should be interpreted in the broadest way, so that "on" not only means "directly on something", but also includes the meaning of "on something" with intermediate features or layers therebetween, and "above" or "over" not only means "above" or "over" something, but also includes the meaning of "above" or "over" something without intermediate features or layers therebetween (i.e., directly on something).

FIG. 1 is a schematic circuit diagram of an example memory device 30 according to some aspects of the present disclosure. The memory device 30 includes a memory cell array 301 and a peripheral circuit 302 coupled to the memory cell array 301. The memory cell array 301 may be a NAND flash memory device cell array in which memory cells 306 are disposed in the form of an array of memory strings 308 of NAND memory devices. The memory string 308 of each NAND memory device extends vertically above a substrate. In some examples, the memory string 308 of each NAND memory device includes a plurality of memory cells 306 which are coupled in series and stacked vertically. Each memory cell 306 may maintain a continuous analog value, such as a voltage or a charge, depending on the number of electrons captured in an area of the memory cell 306. Each memory cell 306 may be a floating gate type memory device cell including a floating gate transistor or a charge capture type memory device cell including a charge capture transistor. It should be noted that for illustrative purposes, the NAND memory device of the present disclosure is only an example. The memory device 30 may include any suitable solid-state non-volatile memory devices, such as a NOR flash memory, a FeRAM, a PCM, a MRAM, a STT-AM or a RRAM, etc.

FIG. 1 shows a schematic diagram of an example memory device including a peripheral circuit. As shown in FIG. 1, the example memory device may include a memory cell array 301 and the peripheral circuit 302 coupled to the memory cell array 301. The memory cell array 301 may be a NAND flash memory array. The memory cell 306 is provided in the form of an array of NAND memory strings 308, and each NAND memory string 308 extends vertically above a substrate (not shown). In some examples, each NAND memory string 308 includes a plurality of memory cells 306 which is coupled in series and stacked vertically. Each memory cell 306 may maintain a continuous analog value, such as a voltage or a charge, depending on the number of electrons captured in an area of the memory cell 306. Each memory cell 306 may be a floating gate type memory device cell including a floating gate transistor or a charge capture type memory device cell including a charge capture transistor.

As shown in FIG. 1, each NAND memory string 308 may include a source selection gate (SSG) 310 at its source end and a drain selection gate (DSG) 312 at its drain end. The SSG 310 and the DSG 312 may be configured to activate a selected NAND memory string 308 (a column of the array) during read and/or program (e.g., write) operations. In some examples, sources of the NAND memory strings 308 in the same memory block 304 are coupled through the same source line (SL) 314 (for example, a common SL). In other words, according to some examples, all NAND memory strings 308 in the same memory block 304 have an array common source (ACS). According to some examples, the DSG 312 of each NAND memory string 308 is coupled to a corresponding bit line 316, and data may be read and/or written from/to the bit line 316 via an output bus. In some examples, each NAND memory string 308 is configured to be selected or deselected by applying a selection voltage (for example, a voltage higher than a threshold voltage of a transistor with the DSG 312) or a deselection voltage (for example, 0V) to the corresponding DSG 312 via one or more DSG lines 313 and/or applying a selection voltage (for example, a voltage higher than a threshold voltage of a transistor with the SSG 310) or a deselection voltage via one or more SSG lines 315 to the corresponding SSG 310.

As shown in FIG. 1, the NAND memory strings 308 may be organized into a plurality of memory blocks 304, each of which may have a common source line 314 (for example, coupled to the ground). In some examples, each memory block 304 is a basic data unit for an erase operation, that is, all memory cells 306 on the same memory block 304 are erased at the same time. In order to erase the memory cells 306 in the selected memory block 304, an erase voltage (Vers) (e.g., a high positive voltage which is 20 V or higher) may be coupled to the source line 314 of the selected memory block 304 and the unselected memory block 304 on the same plane as the selected memory block 304. It should be understood that in some examples, the erase operation may be performed at a half-block level, at a quarter-block level, or at a level with any suitable number of blocks or any suitable fraction of blocks. The memory cells 306 of the adjacent NAND memory strings 308 may be coupled through a word line 318, which selects which line of the memory cell 306 receives read and program/write operations. In some examples, the memory cells 306 coupled to the same word line 318 is called a page 320. The page 320 is a basic data unit for the program operation or the read operation. The size of the page 320 in bits may be related to the number of NAND memory strings 308 coupled by the word line 318 in one memory block 304. Each word line 318 may include a plurality of control gates (e.g., gate electrodes) at each memory cell 306 in the corresponding page 320 and gate lines coupling the control gates.

In some examples, each memory cell 306 is a single-level cell (SLC) that has two possible data states and, thus, may store one bit of data. For example, a first data state "0" may correspond to a first voltage range, and a second data state "1" may correspond to a second voltage range. In some examples, each memory cell 306 can store more than a single bit of data in more than two data states. For example, a multi-level cell (MLC) may store two bits of data, a triple-level cell (TLC) may store three bits of data, or a quad-level cell (QLC) may store four bits of data, or a penta-level cell (PLC) may store five bits of data.

As shown in FIG. 1, the memory strings 308 of a plurality of NAND memory devices may be organized into the plurality of memory blocks 304. In some examples, each memory block 304 is a basic data unit for an erase operation, that is, all memory cells 306 on the same memory block 304 are erased at the same time.

Figure 2:
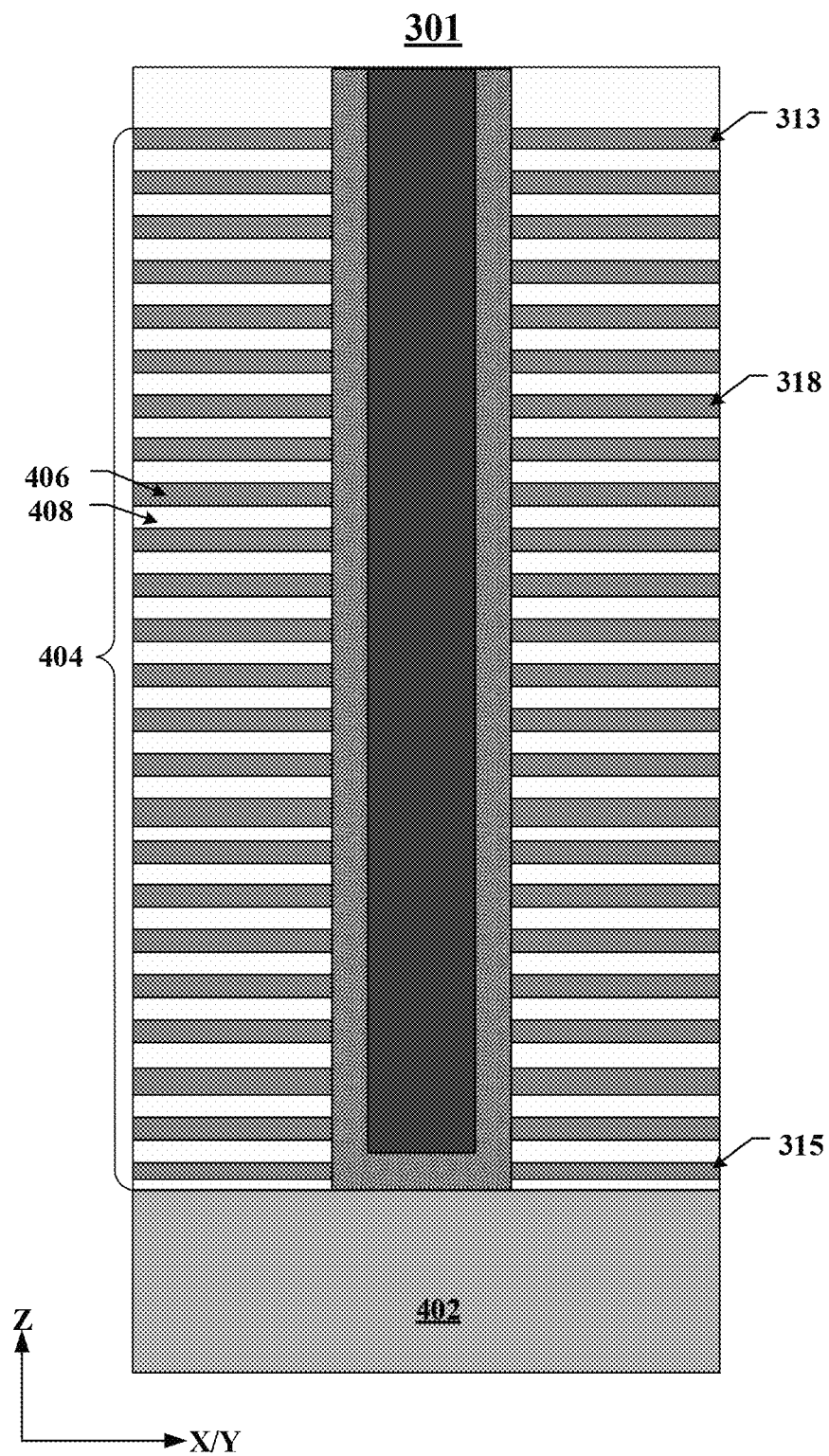
FIG. 2 shows a side view of a cross section of a memory string of an example memory cell array according to some aspects of the present disclosure.

FIG. 2 shows a side view of a cross section of a memory string 308 of an example memory cell array 301 including NAND memory devices according to some aspects of the present disclosure. As shown in FIG. 2, the memory string 308 of the NAND memory device may extend vertically through a stack structure 404 above a substrate 402. The substrate 402 may be made of silicon (such as monocrystalline silicon), silicon germanium (SiGe), gallium arsenide (GaAs), germanium (Ge), silicon-on-insulator (SOI), germanium-on-insulator (GOI), and/or any other suitable material. The stack structure 404 may include alternating conductive layers 406 and dielectric layers 408. The number of the conductive layers 406 and the number of dielectric layers 408 in the stack structure 404 may determine the number of memory cells 306 in the memory cell array 301. The conductive layer 406 may be made of a conductive material which includes but is not limited to tungsten (W), cobalt (Co), copper (Cu), aluminum (Al), polysilicon, doped silicon, silicide or any combination thereof.

Figure 3:
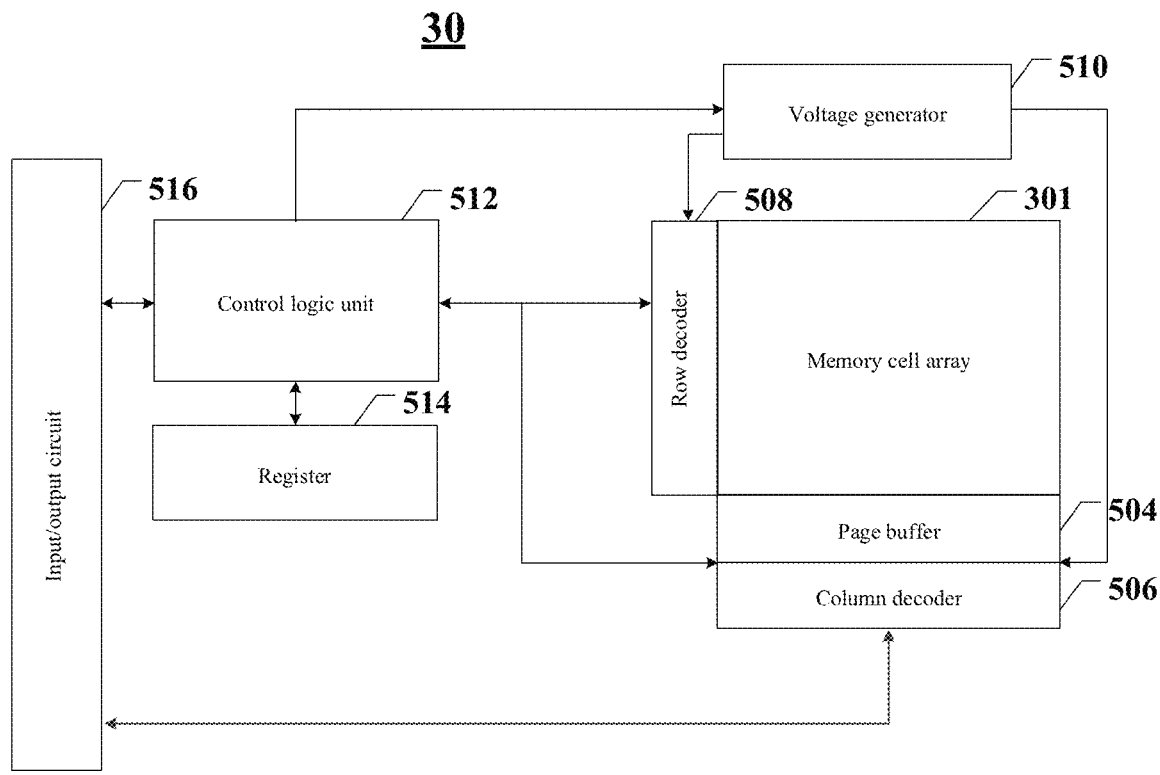
FIG. 3 shows a schematic circuit diagram of a peripheral circuit in some example memory devices.

Based on the memory cell array 301 shown in FIG. 1, FIG. 3 shows a schematic circuit diagram of some example peripheral circuits 302 which include a read/write circuit 504, a column decoder 506, a row decoder 508, a voltage generator 510, a control circuit 512, a register 514, and an input/output (I/O) circuit 516. It should be understood that in some examples, additional circuits (e.g., peripheral circuits) not shown in FIG. 3 may also be included. The memory cell array 301 may be addressed via the word line via the row decoder 508 and the bit line via the column decoder 506. An external signal and data are transmitted between a host and a memory controller via a signal line. The control circuit 512 is configured to cooperate with the read/write circuit 504 to perform a storage operation on the memory cell array 301. The control circuit 512 of this example includes a state machine, an on-chip address decoder, and a power control module. The state machine of this example is configured to provide chip level control for storage operations. The on-chip address decoder of this example is configured to provide an address interface between an address used by the host or the memory controller of a memory system 100 and a hardware address used by the column decoder 506 and the row decoder 508. The power control module of this example is configured to control the power and voltage supplied to the word line and bit line at each memory operation device.

Figure 4:
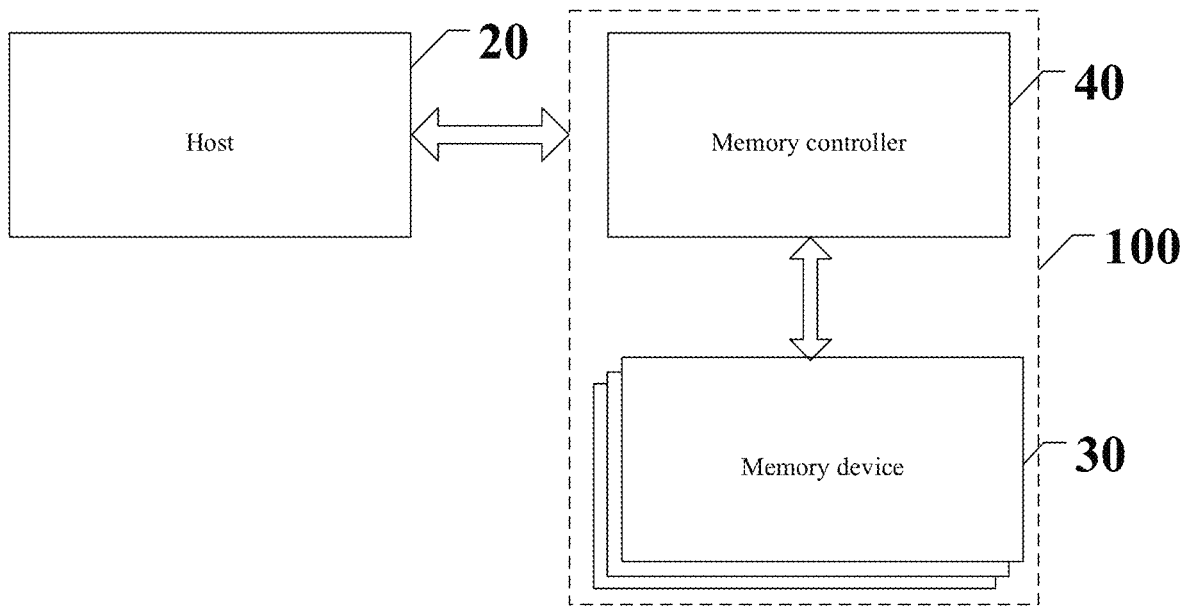
FIG. 4 shows a schematic structural diagram of some example electronic devices.

FIG. 4 is a schematic structural diagram of an electronic device 1000. The electronic device 1000 includes a host 20, which may send a command CMD and/or data to the memory system 100 for storage in the memory device 30, and may receive response RES and/or data read from the memory device 30 from the memory system 100. For example, the host 20 may be implemented as and/or include an application processor (AP) and/or a system on chip (SoC). For example, the host 20 may be implemented as and/or include, but is not limited to, an integrated circuit, a main board, and/or a database server.

The host 20 may communicate with the memory system 100 through various interfaces. In some examples, the host 20 is electrically connected to the memory system 100 via a hot-swappable interface using a cable. The memory controller 40 may control all operations of the memory system 100. The memory controller 40 may write data to the memory device 30 and/or read data from the memory device 30 in response to the command CMD from the host 20.

The memory cell array 301 in the memory system 100 discussed above is erasable, programmable and readable. The memory cells in the memory system 100 may be provided as single-level cells or multi-level cells. Further, the multi-level cells may be divided into multi-level cells (MLC), triple-level cells (TLC), quad-level cells (QLC), etc. Thus for a memory page, a threshold voltage of the programmed memory cell should be within one or more distributions at the end of the successful programming process (with verification). In practice, different memory cells have different data states.

The SLC corresponds to two threshold voltage distributions: E and P. The threshold voltage distribution E corresponds to an erased data state. The threshold voltage distribution P corresponds to a programmed data state. The threshold voltage of the threshold voltage distribution E corresponding to the erased data state is smaller than the threshold voltage of the threshold voltage distribution P corresponding to the programmed data state. Thus, a memory cell having a threshold voltage in the threshold voltage distribution E is in the erased data state, and a memory cell having a threshold voltage in the threshold voltage distribution P is in the programmed data state. In some examples, the SLC memory cell stores one bit of data. In a specific example, the erased memory cell stores data of logic value "1" and the programmed memory cell stores data of logic value "0".

Figure 5A:
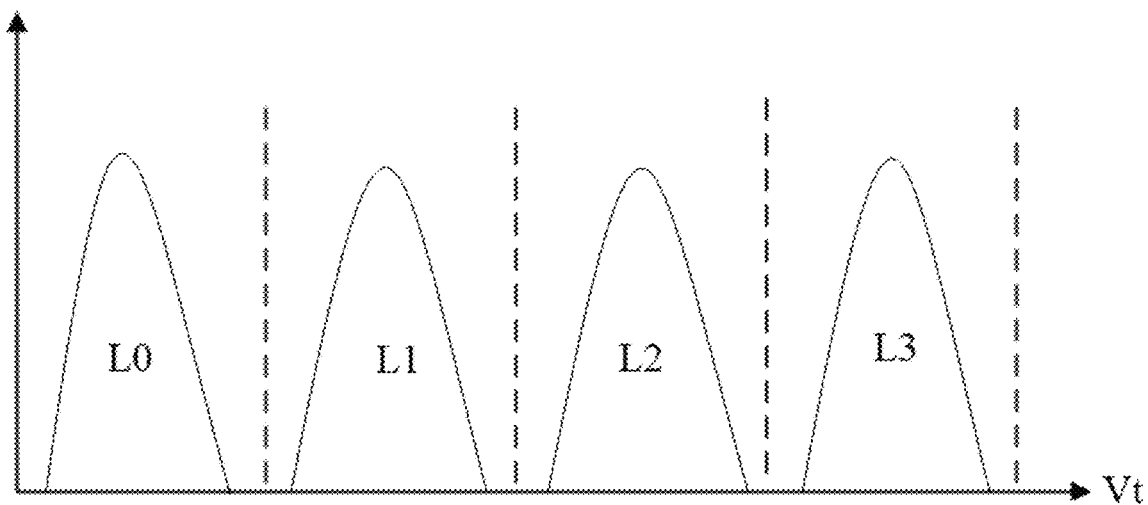
FIG. 5A shows a schematic diagram of four threshold voltage distributions of some example MLCs.

As shown in FIG. 5A, the MLC corresponds to four threshold voltage distributions: L0, L1, L2 and L3. These distributions L0, L1, L2, L3 exhibit sequentially increasing threshold voltages. Similarly, the threshold voltage distribution L0 corresponds to the erased data state, and the threshold voltage distributions L1, L2 and L3 correspond to respective programmed data states. In some examples, the MLC memory cell stores two bits of data. In a specific example, the erased memory cell stores data "11", the memory cell programmed to a data state L1 stores data "10", the memory cell programmed to a data state L2 stores data "01", and the memory cell programmed to a data state L3 stores data "00".

Figure 5B:
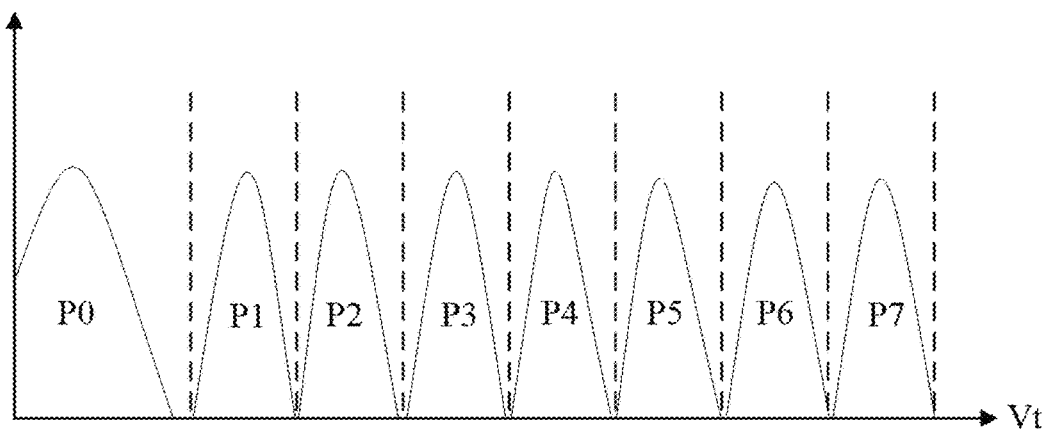
FIG. 5B shows a schematic diagram of eight threshold voltage distributions of some example TLCs.

As shown in FIG. 5B, the TLC corresponds to eight threshold voltage distributions: P0, P1, P2, P3, P4, P5, P6, and P7, with sequentially increasing threshold voltages. Similarly, the threshold voltage distribution P0 corresponds to the erased data state, and the threshold voltage distributions P1, P2, P3, P4, P5, P6, and P7 correspond to respective programmed data states. In some examples, the TLC memory cell stores three bits of data. In a specific example, the erased memory cell stores data "111"; the memory cell programmed to a data state P1 stores data "110"; the memory cell programmed to a data state P2 stores data "101"; the memory cell programmed to a data state P3 stores data "100"; the memory cell programmed to a data state P4 stores data "011"; the memory cell programmed to a data state P5 stores data "010"; the memory cell programmed to a data state P6 stores data "001"; and the memory cell programmed to a data state P7 stores data "000".

The QLC corresponds to 16 threshold voltage distributions: P0, P1, P2, P3, P4, P5, P6, P7, P8, P9, P10, P11, P12, P13, P14, P15, with sequentially increasing threshold voltages. Similarly, the threshold voltage distribution P0 corresponds to the erased data state, and the threshold voltage distributions P1, P2, P3, P4, P5, P6, P7, P8, P9, P10, P11, P12, P13, P14, P15 correspond to respective programmed data states. A data state N has a higher threshold voltage than a data state N−1 and a lower threshold voltage than a data state N+1. In some examples, the QLC memory cell may store four bits of data. In a specific example, the erased memory cell may store data "1111", and the memory cells programmed to data states P1, P2, P3, P4, P5, P6, P7, P8, P9, P10, P11, P12, P13, P14 and P15 may store data "0111, 0101, 0001, 1001, 1000, 0000, 0100, 0110, 0010, 0011, 1011, 1010, 1110, 1100, 1101" in sequence.

It should be noted that regardless of the types of the memory cells described above, each threshold voltage distribution (data state) corresponds to a preset value of a group of data bits stored in the memory cell, and the specific relationship between the data programmed into the memory cell and the threshold voltage level of the memory cell depends on a data encoding solution adopted by the memory cell. A Gray encoding solution is an example of such a data encoding solution. The Gray encoding solution is a one-to-one mapping code to convert a digit into a binary code, and meets the following condition: the Gray codes of two adjacent digits differ by only one binary bit, and the last digit and the first digit also meet this condition. For example, the following mapping is a Gray code: 0-000, 1-001, 2-011, 3-010, 4-110, 5-111, 6-101 and 7-100, in which (0, 1), (1, 2), . . . , (6, 7) and (7, 0) all differ by only one bit.

Figure 6:
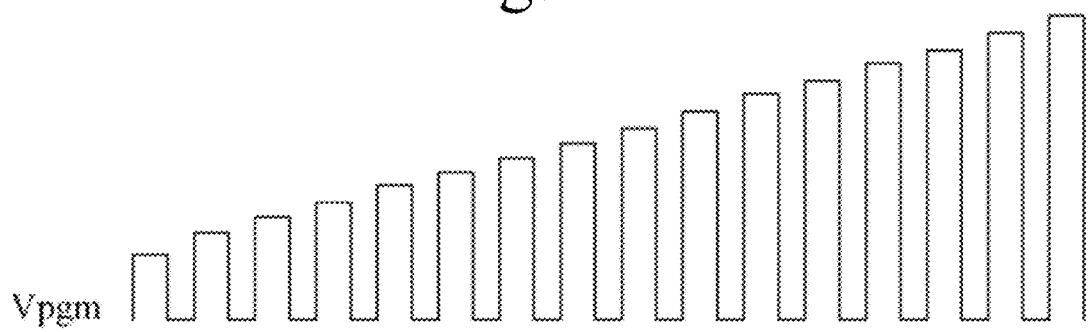
FIG. 6 is a schematic structural diagram of stepping pulse of an ISPP mode provided according to an example of the present disclosure.

In practice, for a flash memory device with multiple data states, for example, a NAND flash memory device, in order to reduce coupling and disturbance between word lines when the memory cells are programmed, in some examples, multi-pass programming may be adopted when a memory page or block is programmed to achieve a closer threshold voltage distribution. In some examples, the multi-pass programming may include two-pass programming, three-pass programming, etc. The two-pass programming may include a first-pass rough programming and a fine programming. The three-pass programming may include a first-pass rough programming, a second-pass rough programming and a fine programming. Here, the last-pass programming in the multi-pass programming is a fine programming. The first-pass rough programming and the second-pass rough programming are collectively referred to as rough programming, and may also be referred to as non-last-pass programming. In some examples, both of the non-last-pass programming and the fine programming may be in an incremental step pulse programming (ISPP) mode. The ISPP solution may program the memory cells in the selected memory page several times while gradually increasing bias voltages of the word lines based on step voltages. See FIG. 6 for an example incremental step pulse Vpgm. In order to give consideration to the programming speed and a wide read window margin (RWM), in some examples, in the non-last-pass programming (all rough programming stages), a programming voltage pulse with a larger set step length (for example, 0.5 volts (V)) is applied to a selected word line (the word line that is selected to be coupled to the memory cell to be programmed) to rapidly program the memory cell coupled to the selected word line to an intermediate data state. In the fine programming stage after all the rough programming stages, a programming voltage pulse with a small set step length (for example, 0.2V) is applied to the selected word line to accurately program the memory cell coupled to the selected word line to a final data state. That is, in some examples, in each pass of the multi-pass programming, the programming voltage/pulse applied in the programming operation is increased according to different set step lengths, and the specific set step length may be set (e.g., by a designer) according to actual programming situations. The intermediate data state is one or more data states before the programmed memory cell reaches the final data state, (i.e., before the last programmed data state). For example, by taking the TLC memory cell as an example, the intermediate data state may be at least one of S1 and S2 or other verifiable data states if the final data state of the memory cell is S3. The final data state is a data state to which a user expects the programmed memory cell to be programmed. For example, the final data state is S3 when the TLC memory cell is programmed.

Figure 7:
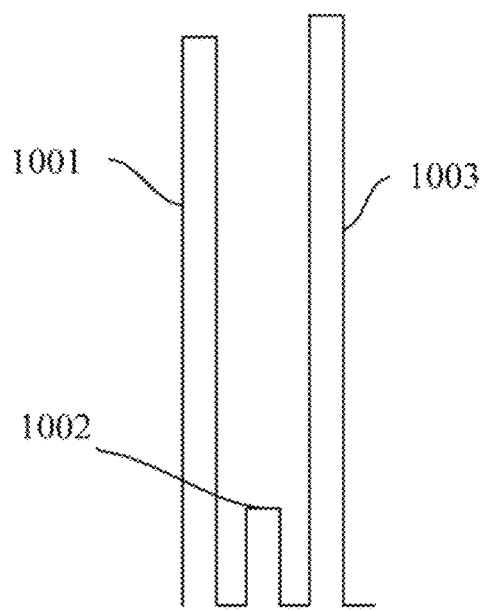
FIG. 7 is a schematic diagram of a verification voltage pulse provided according to an example of the present disclosure.

It should be understood that during programming of the memory cell, in order to know whether the memory cell is programmed to a target programmed data state, a verification operation is performed between the application of two programmed voltage pulses, to determine whether the programmed memory cell is programmed to a target data state. The programming operation and the verification operation are performed alternately. The process of applying a programmed voltage pulse is also called a programming operation. The verification operation may be one or a set of verification voltage pulses as shown in FIG. 7, in which 1001 and 1003 are step programming pulses Vpgm, and 1002 is a verification voltage pulse. Based on the previous descriptions, the multi-pass programming may include at least one pass of rough programming and one pass of fine programming. Each pass of programming includes at least one programming operation and at least one verification operation.

As the capacity of the NAND Flash increases, the number of data bits correspondingly stored in the memory cell also increases. That is, the SLC→MLC→TLC→QLC→PLC have more and more threshold voltage distributions corresponding to different data states. Based on the above example, each programming level is set to correspond to one threshold voltage distribution, and the following programming levels are the above-mentioned different data states (including one erased state and $2^N-1$ programmed states, N being the number of data bits stored at most in the memory cell).

The memory controller 40 may program the data received from the host 20 into the memory device 30, and decode and send the data read from the memory device 30 to the host 20. The threshold voltage corresponds to more and more states as the capacity of the memory device increases. Some states have the longest programming duration, the poorest data retention capability and the worst disturbance suppression state in the programming process, which adversely affects the performance of the memory device.

The present disclosure will be further explained in detail with reference to the drawings and specific examples below.

Referring to FIG. 4, an example of the present disclosure provides a memory controller 40. The memory controller 40 is used to control a memory device 30. The memory device 30 includes at least one memory cell which provides at most $2^N$ programming levels for storing N bits of data, and N is a positive integer. The memory controller 40 is configured to perform the operations of the memory system 100 as shown in FIG. 11.

In S100, data to be stored is examined to find a binary code to be replaced. The binary code corresponds to a preset programming level to be replaced. The data is to be stored by being written into the memory cell.

In some examples, as described in above, different data states correspond to different binary codes of the stored data, and different memory cells have $2^N$ different data states corresponding to the number of bits of the stored data. Since the programming levels correspond to the data states, $2^N$ programming levels correspond to $2^N$ binary codes respectively. The $2^N$ binary codes include one binary code corresponding to the erased data state and $2^N-1$ binary codes corresponding to the programmed data state.

In more detail, the memory controller 40 receives the data to be stored from the host. before writing the data from the host into the memory cell of the memory device, the memory controller 40 verifies the data to be stored and determines whether the binary code corresponding to the preset programming level to be replaced can be found in the data.

In some examples, the memory controller 40 is configured to:
set one programming level in the $2^N$ programming levels as a preset programming level to be replaced, and a binary code corresponding to the preset programming level to be replaced as a binary code to be replaced; and
set another programming level in the $2^N$ programming levels as a preset replacement programming level, and a binary code corresponding to the preset replacement programming level as a replacement binary code.

In some examples, the memory controller 40 sets one of the $2^N$ programming levels as the preset programming level to be replaced, and another of the $2^N$ programming levels as the preset replacement programming level (i.e., as programing level to replace the programming level identified by the binary code), such that the binary code corresponding to the preset programming level to be replaced is a binary code to be replaced, and the binary code corresponding to the preset replacement programming level is a replacement binary code. In this example, the binary code to be replaced (i.e., the binary code corresponding to the preset programming level to be replaced) is substituted with the replacement binary code (i.e., with the replacement binary code corresponding to the preset replacement programming level to be used), so that the data storage capacity of the replacing relationship between the preset programming level to be replaced and the new preset replacement programming level can be reduced, and the data computation power of the memory controller 40 can be saved.

In some examples, the memory controller 40 is configured to:
set at least two programming levels in the $2^N$ programming levels as preset programming levels to be replaced, and binary codes corresponding to the preset programming levels to be replaced as binary codes to be replaced; and
set at least two other programming levels in the $2^N$ programming levels as preset replacement programming levels, and binary codes corresponding to the preset replacement programming levels as replacement binary codes.

In some examples, the memory controller 40 sets at least two of the $2^N$ programming levels as the preset programming levels to be replaced, and at least two other of the $2^N$ programming levels as the replacement preset programming levels, such that the binary codes respectively corresponding to the at least two preset programming levels to be replaced are binary codes to be replaced, and the binary codes respectively corresponding to the replacement preset programming levels are replacement binary codes. According to the present disclosure, the binary codes to be replaced (i.e., the codes corresponding to the at least two preset programming level to be replaced) are substituted with the replacement binary codes (i.e., with the codes corresponding to the at least two preset replacement programming levels). Although the data storage capacity of the replacing relationship between the preset programming levels to be replaced and the preset replacement programming levels is increased since there are more replacing combinations of the at least two preset programming levels to be replaced and the at least two preset replacement programming levels, the flexibility in replacing the programming level by the data to be stored can be improved, and the performance of the memory device can be improved as a whole, such as shortening the programming duration and the erasing cycle.

In some examples, the preset programming levels to be replaced are M programming levels with the longest programming duration among all the programming levels, the preset replacement programming levels are M programming levels with the shortest programming duration among all the programming levels, wherein M<N, and M and N being positive integers.

In some examples, the memory controller 40 applies a programming voltage by operating the memory device in an ISPP solution. The ISPP solution is implemented by increasing the programming voltage in unit of step voltage from a preset programming starting voltage. In response to applying the programming voltage, a verification voltage is applied to a programmed memory block for programming verification. During the programming operation, the memory controller 40 receives a programming (or writing) command and memory address information. The memory controller 40 partially decodes the memory address into row address information and column address information. The memory controller 40 controls a voltage generator 510 to generate a programming voltage Vpgm for programming data in the memory cell array 301 and provides the row address information for a row decoder 508. The row decoder 508 selectively supplies a word line voltage from the voltage generator 510 for a word line WL of the memory cell array 301 in response to the row address information. At least in this example, the row decoder 508 may select a memory block in response to a block address, and select a page therein. When a voltage is applied, the row decoder 508 applies a sufficiently high voltage to turn on a string selection transistor SST, and applies a low voltage to a ground/source transistor GST. The row decoder 508 supplies an unselected voltage to an unselected memory cell transistor MCT in order to prevent these unselected memory cells MC from changing their threshold distribution states. The row decoder 508 also applies a programming voltage Vpgm to the word lines WL of one or more selected memory cells. The programming voltage Vpgm starts with an initial voltage and increases incrementally in each programming cycle until the data is programmed. Verification operations then confirm that the data is successfully programmed. For example, the programming voltage may vary from 15V to 20V. Similarly, the column decoder 506 may perform programming by the ISPP solution as programming of the row decoder. In summary, several cycles of iterative processes are performed, and each cycle includes a program pulse application step for progressively increasing the threshold voltage and a verification reading step for determining whether the target threshold voltage is reached.

Figure 8:
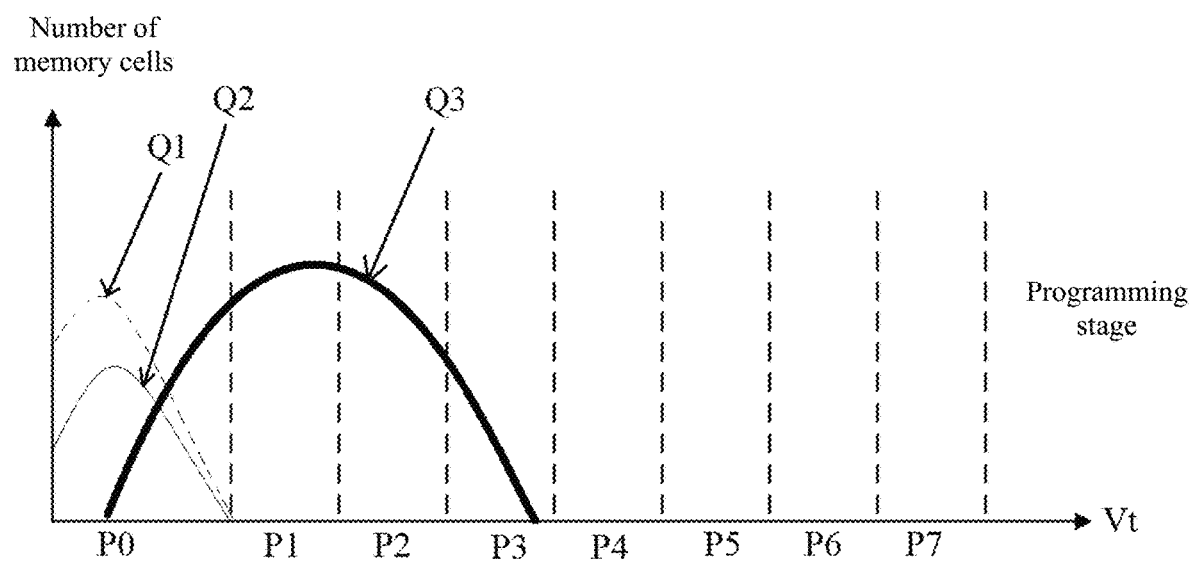
FIG. 8 shows a schematic diagram of the eight threshold voltage distributions of the TLC that correspond to programming duration of a second programming stage provided according to an example of the present disclosure.

As shown in FIG. 8, all memory cells corresponding to a curve Q1 are in an erased state, a curve Q2 indicates an erasing suppression corresponding to P0, and a curve Q3 indicates a distribution of memory cells within four programming states. In the case that the memory controller 40 complementally applies the programming voltage Vpgm to the memory block by a peripheral circuit 302, since the data retention capacity of the highest state in the $2^N$ states is poor, and programming is performed from the first programming state to the last programming state in the process of applying the programming voltage to the $2^N$ states of the memory cell for programming, the programming duration of the highest state of the $2^N$ states is also the longest. Accordingly, the memory controller 40 sets the M programming levels with the longest programming duration of the $2^N$ programming levels as the preset programming levels to be replaced, and sets the M programming levels with the shortest programming duration of the $2^N$ programming levels as the preset replacement programming levels, (i.e., the remaining M programming levels other than the M programming levels with the longest programming duration may be set as the preset replacement programming levels). By taking the TLC as an example, the preset programming level to be replaced is an erased data state corresponding to the threshold voltage distribution P0, and the preset replacement programming level is a programmed data state corresponding to the threshold voltage distribution P7. In some examples, the time to program the memory device can, thus, be shortened.

In some examples, the preset programming levels to be replaced are M programming levels with a poorest data retention capability among all programming levels. In some such examples, the preset replacement programming levels are M programming levels with a strongest data retention capability among all the programming levels, wherein M<N, and M and N are positive integers.

Figure 9A:
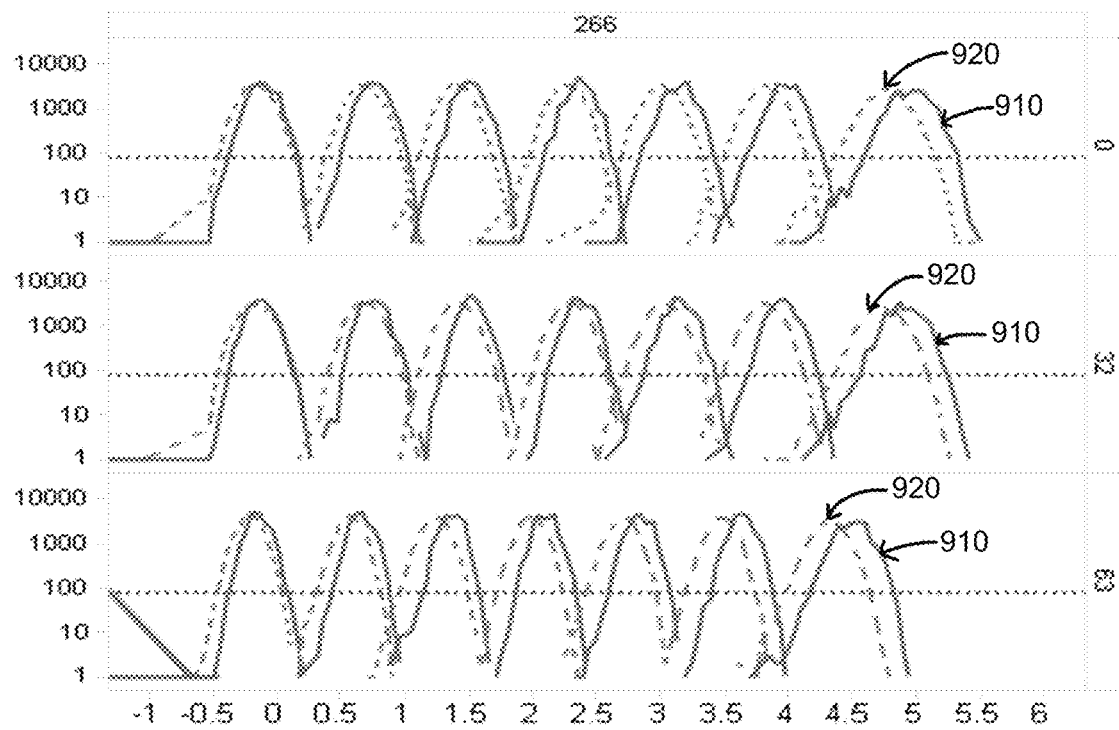
FIG. 9A shows a schematic diagram of an effect of electric charge leakage corresponding to one time of an erasing cycle of a memory block provided according to an example of the present disclosure.
Figure 9B:
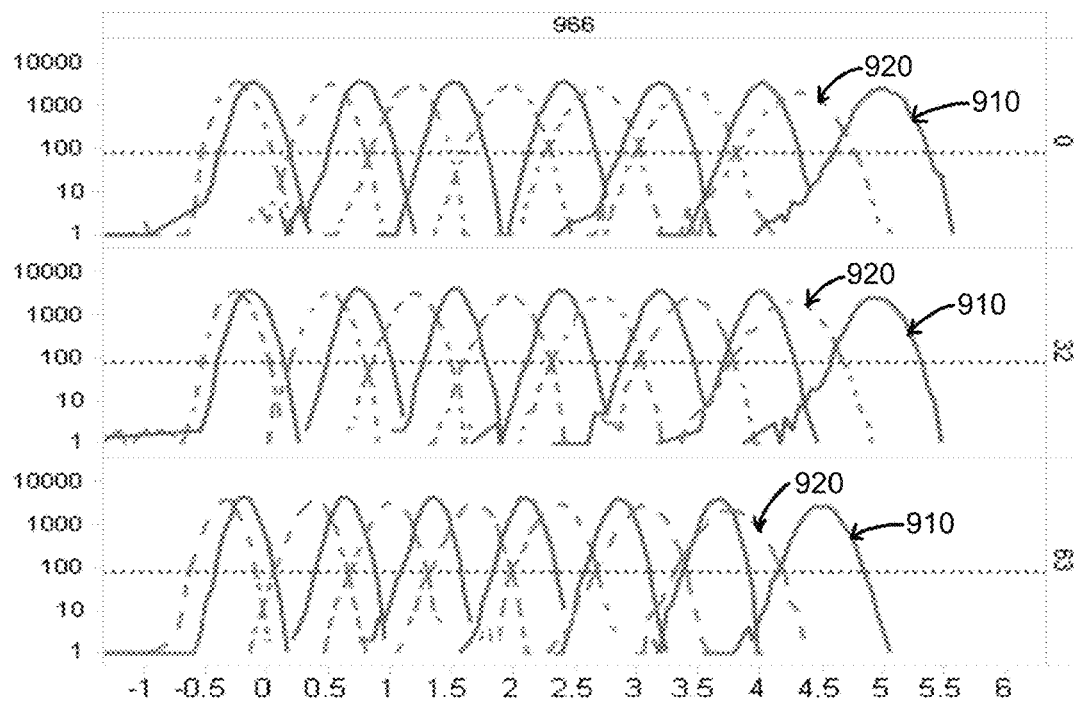
FIG. 9B shows a schematic diagram of an effect of electric charge leakage corresponding to 3000 times of erasing cycles of a memory block provided according to an example of the present disclosure.

FIG. 9A and FIG. 9B illustrate charge leakage (from 1010 to 1020) caused when the memory block performs one to 3,000 erasing cycles. In case of data loss, the charge leakage of the highest state may be more severe as the erasing cycle of the memory block increases. Accordingly, the memory controller 40 sets the M programming levels with the poorest data retention capacity of the $2^N$ programming levels as the preset programming levels to be replaced, and sets the M programming levels with the strongest data retention capacity of the $2^N$ programming levels as the preset replacement programming levels, (i.e., the remaining M programming levels other than the M programming levels with the poorest data retention capacity may be set as the preset replacement programming levels). By taking the QLC as an example, the preset programming level to be replaced is a programmed data state corresponding to the threshold voltage distribution P13, and the preset replacement program level is the erased data state corresponding to the threshold voltage distribution P0. According to this example, the data retention capability of the memory device can be improved and the programming duration can be indirectly shortened.

In some examples, the preset programming levels to be replaced are M programming levels with a worst disturbance suppression state among all programming levels, and the preset replacement programming levels are M programming levels with a best disturbance suppression state among all the programming levels, wherein M<N, and M and N being positive integers.

In some examples, the disturbance of the memory device includes, but is not limited to, reading disturbance, writing disturbance, and/or programming disturbance. For the case of disturbance, the charge leakage of the highest state may be more severe as the erasing cycle of the memory block increases. Accordingly, the memory controller 40 sets the M programming levels with the worst disturbance suppression state of the $2^N$ programming levels as the preset programming levels to be replaced, and sets the M programming levels with the best disturbance suppression state of the $2^N$ programming levels as the preset replacement programming levels, (i.e., the remaining M programming levels other than the M programming levels with the worst disturbance suppression state may be set as the preset replacement programming levels). In some examples, the disturbance suppression capability of the memory device and the accuracy of data storage of the memory device can be improved.

For example, the memory controller 40 sets the M programming levels with the worst reading disturbance suppression state of the $2^N$ program levels as the preset programming levels to be replaced, and sets the M programming levels with the best reading disturbance suppression state of the $2^N$ program levels as the preset replacement programming levels, which can reduce or eliminate the influence of a data reading operation on charges stored on the memory device, thereby effectively suppressing the probability of reading disturbance, increasing the probability of correctly reading the data stored in the memory device, and/or helping to improve the reading times of the data stored in the memory cell.

In S200, the binary code to be replaced (i.e., the binary code identified in S100 in the data to be stored) is substituted with a replacement binary code corresponding to a preset replacement programming level, and a replacement identifier linking a memory address corresponding to the replacement binary code is generated.

In some examples, if the memory controller 40 finds the binary code to be replaced (i.e. the binary code corresponding to the preset programming level to be replaced), the memory controller 40 substitutes the replacement binary code in place of the found binary code, and generates a replacement identifier. The replacement identifier can distinguish, by means of marking, the original preset replacement programming level in the data to be stored from the new preset replacement programming level substituted for and changed from the preset programming level to be replaced. In addition, in some examples, the replacement identifier may be associated with the memory address of the memory cell which will store the data (i.e., the data to be stored sometimes referred to herein as input data), such that in response to reading and obtaining the read data from the memory device in the following example, the memory controller 40 obtains, by decoding the read data and the replacement identifier linked to the memory address of the memory cell, the original data to be stored and sends it to the host 20.

For example, by taking the QLC as an example for replacement of the binary code, it is assumed that the input data (i.e., the data to be stored) includes the binary code 1111 corresponding to the programming level P0 and the binary code 1101 corresponding to the programming level P15, (i.e., the input data to be stored includes "1111" and "1101"). If the preset programming level to be replaced is P15 and the preset replacement programming level is P0, the memory controller 40 substitutes the binary code 1101 corresponding to the preset programming level P15 to be replaced in the input data with another binary code 1111, and the memory controller 40 marks the change of the original binary code 1101 to 1111 in data to be tested with a replacement identifier, so as to distinguish the original replacement binary code in the input data from the replacement binary code changed from the binary code to be replaced.

In some examples, the number of states corresponding to the threshold voltage distribution Vt is reduced by modifying the data encoding mode of a randomizer encoder in the memory controller 40, which can reduce the reading disturbance, the programming disturbance, etc. while helping to reduce the programming duration of the memory device, and can also improve the data retention capability of the memory device to improve the reliability of the data. In addition, since the data retention capability is enhanced, and the stronger the data retention capability is, the less the periodic refresh cycle times of a firmware are, the erasing cycle overhead of the memory device can be reduced and the service life of the memory device can be prolonged.

In some examples, the memory controller 40 is configured to:
compare the input data to be stored with the binary code to be replaced; and
determine that the preset programming level to be replaced exists in the input data to be stored if the binary code to be replaced exists in the input data to be stored.

In some examples, the input data sent by the host to the memory controller 40 contains a wide variety of characters, which may include numbers, letters, and/or characters. However, before sending the input data to the memory device in the memory system for storage, the host may convert non-binary characters in the input data (such as octal data 2 to 7, decimal data 2 to 9 and English characters) into binary coded data in binary expression, (i.e., the input data to be stored is also a set of data composed of binary characters 0 and 1).

In some examples, the data is related to at least n bits of data stored in the memory cell of the memory device, i.e., the data length or the data size C of the data to be stored is K times of the number of bits N of the data supported by the memory cell, C=KN, and C, K and N are all positive integers. In response to receiving the input data to be tested from the host, the memory controller 40 divides the input data (e.g., in binary expression) into K character segments according to the number of bits N of the data that can be stored in the memory cell of the connected memory device. Then, the memory controller 40 queries any one or more preset binary codes to be replaced in the following examples for comparison. It can be determined that there is a preset programming level to be replaced in the input data if at least one of the K character segments corresponding to the input data is the same as the binary code to be replaced. Otherwise, it can be determined that there is no preset programming level to be replaced in the input data if all of the K character segments corresponding to the input data are different from the binary code to be replaced.

In some examples, the memory controller 40 is configured to: store the replacement identifier, and a replacing relationship between the binary code to be replaced and the replacement binary code marked by the replacement identifier.

In some examples, the memory controller 40 generates the replacement identifier for distinguishing the original replacement binary code in the input data from the replacement binary code changed from the binary code to be replaced, and then stores the generated replacement identifier in a local storage space. In addition, the memory controller 40 also needs to store the replacing relationship between the binary code to be replaced and the replacement binary code marked by the replacement identifier, so that in response to reading and obtaining the read data from the memory device, the memory controller 40 may decode the read data, the replacing relationship between the binary code to be replaced and the replacement binary code marked by the replacement identifier, and the replacement identifier linked to the memory address of the memory cell to obtain the original data to be stored and send it to the host 20.

In some examples, the replacement identifier is a binary number.

In some examples, the replacement identifier may be a binary number 0 or a binary number 1, or a combination of multiple binary numbers 0 and multiple binary numbers 1. Preferably, the replacement identifier is a 1-bit binary number, so that the memory controller 40 may reduce the data storage footprint for the replacement identifier.

In some examples, the binary code to be replaced differs from the replacement binary code by one bit.

In some examples, the binary code to be replaced differs from the replacement binary code by multiple bits, which also falls within the scope of protection of the present patent. In some examples, the binary code to be replaced differs from the replacement binary code by one bit. In this way, the memory controller 40 may directly perform binary logic calculation on the replacement identifier of a 1-bit binary number and the replacement binary code marked with the replacement identifier to obtain the original binary code to be replaced. Taking the MLC as an example, if the replacement binary code is 01 and the replacement identifier is 1, the replacement binary code "01" and the replacement identifier "1" are logically calculated to obtain the original binary code to be replaced as 11.

Taking the QLC as an example, if the replacement binary code is 1110 and the replacement identifier is 1, the replacement binary code "1110" and the replacement identifier "1" are logically calculated to obtain the original binary code to be replaced as 1111.

Taking the QLC as an example, the data stored in 16 programming levels, i.e., 16 states, of the QLC are P0 to P15 as in the foregoing example. As shown in FIG. 10, the first curve from right to left corresponds to P15, and the last curve from right to left corresponds to P0. In the encoding process of the randomizer encoder, if the condition of replacement is to shorten the programming duration, the binary code corresponding to P15 may be directly changed to the binary code corresponding to P0, and a replacement identifier may be added to help distinguish the binary code corresponding to P0 from that corresponding to P0 substituted for P15. The encoding modes of P15 and P0 differ by 1-bit encoding.

If the condition of replacement is to improve the data retention capability, the binary code corresponding to P15 may be directly changed to the binary code corresponding to P4, and a replacement identifier may be added to help distinguish the binary code corresponding to P4 from the binary code corresponding to P4 substituted for P15. The encoding modes of P15 and P4 differ by 1-bit encoding.

If the condition of replacement is to improve the reading disturbance suppression capability, the binary code corresponding to P0 may be directly changed to the binary code corresponding to P13, and a replacement identifier may be added to help distinguish the binary code corresponding to P13 from the binary code corresponding to P13 substituted for P0. The encoding modes of P0 and P13 differ by 1-bit encoding. Of course, the binary code corresponding to P0 may also be changed to the binary code corresponding to P12, and a replacement identifier is added to help distinguish the binary code corresponding to P12 from the binary code corresponding to P12 substituted for P0. The encoding modes of P0 and P12 differ by 2-bit encoding.

In some examples, by substituting the binary encoding mode of the input data to be stored in the memory device, the programming duration of the memory device can be shortened, and charge leakage of the highest state in the PCHTDR test process of the memory device can be avoided, (e.g., the data retention capacity of the memory device can be improved to improve the reliability of the data). In addition, since the data retention capability is enhanced, and the stronger the data retention capability is, the less the periodic refresh cycle times of a firmware are, the erasing cycle overhead of the memory device can be reduced and the service life of the memory device can be prolonged.

In some examples, the memory controller 40 is configured to:
read, based on a memory address in a read command, corresponding read data from the memory device; and
substitute, in the read data, the replacement binary code marked by the replacement identifier with a corresponding binary code to be replaced when the memory address has the corresponding replacement identifier.

In some examples, the flow of operations is opposite to that of binary code replacement for the data to be stored, (i.e., rather than receiving input data to write to the memory, the memory controller 40 receives a read command from the host). The read command includes the memory address of the data to be read from the memory device. In this way, the memory controller 40 reads and obtains the read data corresponding to the memory address from the memory device according to the memory address.

In some examples, the read data (which is read and obtained by the memory controller 40 from the memory device) is binary coded data in binary expression, (i.e., the read data is also a set of data composed of binary characters 0 and 1). In response to receiving the read command from the host, the memory controller 40 reads K character segments with n digits from the K memory cells in the memory device. The K character segments with n digits form read data with the data length or data size C, C=KN, and C, K and N are all positive integers.

Since the replacement identifier is linked to the memory address of the memory cell, the memory controller 40 may know the memory cell from which the character segment with the N bits is read and subjected to binary code replacement when previously programmed and written into the memory device by the memory controller 40. Therefore, in response to reading and obtaining the read data from a plurality of memory cells in the memory device, the memory controller 40 substitutes, according to the replacement identifier linked to the memory address of the memory cell, as well as the replacing relationship between the binary code to be replaced and the replacement binary code marked with the replacement identifier, the replacement binary code marked with the replacement identifier in the read data of the K digits read from a plurality of memory cells with the binary code to be replaced, thus obtaining feedback/output data sent to the host. Then, the memory controller 40 sends the feedback data obtained after substituting the replacement binary code in the read data with the binary code to be replaced, and sends it to the host 20 so as to respond to the read command from the host 20.

In some examples, the memory device includes at least one memory cell which provides at most $2^N$ programming levels for storing N bits of data, and N is a positive integer. In some such examples, the memory device is configured to:
receive a replacement binary code transmitted by a memory controller 40, wherein the replacement binary code is used by the memory controller 40, when a binary code to be replaced corresponding to a preset programming level to be replaced is found in input data to be stored, to substitute the binary code to be replaced with a binary code corresponding to a preset replacement programming level, and the input data is to be written into the memory cell; and
perform programming on the memory cell based on the replacement binary code transmitted by the memory controller to store the input data.

In some examples, the memory device is connected to the memory controller 40 to receive sending data transmitted by the memory controller 40. The sending data corresponds to the data obtained after the memory controller 40 receives the input data from the host and then performs binary coding conversion on the input data. The sending data includes a replacement binary code and non-replacement binary code not subjected to replacement, and the non-replacement binary code not subjected to replacement in the input data is the same as the non-replacement binary code not subjected to replacement in the sending data. The replacement binary code in the data transmitted by the memory controller 40 is obtained by replacement when the memory controller 40 receives the input data from the host. For the specific process of obtaining the replacement binary code by replacement, a reference may be made to the example operation method of the memory controller 40 shown in the figure. In response to receiving the sending data transmitted by the memory controller 40, the memory device programs several memory cells according to several replacement binary codes in the sending data, such that the several memory cells may store the replacement binary code obtained by replacing the binary code to be replaced in the input data. In addition, the memory device programs the non-replacement binary coded data not subjected to replacement in the sending data by the original programming mode of applying an encoding voltage, such that the memory device may write and save the input data from the host 20.

In some examples, the memory device is configured to: store a replacement identifier and a replacing relationship between the binary code to be replaced and the replacement binary code marked by the replacement identifier, wherein the replacement identifier is a flag generated by the memory controller to link the corresponding memory address of the replacement binary code.

In some examples, the memory device may also receive and store the replacement identifier generated by the memory controller 40 after the memory controller 40 generates the replacement identifier. In addition, the memory device may also store the replacing relationship between the binary code to be replaced and the replacement binary code marked with the replacement identifier. Since the memory device stores the replacement identifier, the memory address of the memory cell that stores the replacement binary code may be directly marked, which is more beneficial for the host to obtain the feedback data by binary code replacement according to the read command.

In some examples, the memory device is configured to: the programming levels of the memory cell are less than $2^N$.

In some examples, reducing the number of states corresponding to the threshold voltage distribution Vt of the corresponding programming level of each memory cell in the memory device may help shorten the programming duration of the memory device, reduce the reading disturbance, the programming disturbance, etc., and/or improve the data retention capacity of the memory device.

In some examples, the number of states corresponding to the threshold voltage distribution Vt is reduced by modifying the data encoding mode of a randomizer encoder in the memory controller 40, which can reduce the reading disturbance, the programming disturbance, etc. while helping to reduce the programming duration of the memory device, and can also improve the data retention capability of the memory device to improve the reliability of the data. In addition, since the data retention capability is enhanced, and the stronger the data retention capability is, the less the periodic refresh cycle times of a firmware are, the erasing cycle overhead of the memory device can be reduced and the service life of the memory device can be prolonged.

In some examples a memory system includes:
a memory device, wherein the memory device comprises at least one memory cell which provides at most $2^N$ programming levels for storing N bits of data, and N is a positive integer; and
a memory controller 40 used to control the memory device, wherein the memory controller 40 is configured to:
find, in input data, a binary code to be replaced corresponding to a preset programming level to be replaced, wherein the input data is data to be written into the memory cell; and
substitute the binary code to be replaced in the input data with a replacement binary code corresponding to a preset replacement programming level, and generate a replacement identifier linking a memory address corresponding to the replacement binary code.

In some examples, the number of states corresponding to the threshold voltage distribution Vt is reduced by modifying the data encoding mode of a randomizer encoder in the memory controller 40, which can reduce the reading disturbance, the programming disturbance, etc. while helping to reduce the programming duration of the memory device, and can also improve the data retention capability of the memory device to improve the reliability of the data. In addition, since the data retention capability is enhanced, and the stronger the data retention capability is, the less the periodic refresh cycle times of a firmware are, the erasing cycle overhead of the memory device can be reduced and the service life of the memory device can be prolonged.

In some examples methods of operation of a memory system are provided. The memory system includes a memory device and the memory controller as described in the foregoing examples. The memory device includes at least one memory cell which provides at most $2^N$ programming levels for storing N bits of data, and N is a positive integer. The operation method includes:
finding by the memory controller 40, in input data, a binary code to be replaced corresponding to a preset programming level to be replaced, wherein the input data includes data to be written into the memory cell;
substituting, by the memory controller 40, the binary code to be replaced in the input data with a replacement binary code corresponding to a preset replacement programming level, and generating, by the memory controller 40, a replacement identifier linking a memory address corresponding to the replacement binary; and
receiving, by the memory device, a replacement binary code transmitted by the memory controller 40, and performing, by the memory device, programming on the memory cell based on the replacement binary code transmitted by the memory controller 40 to store the input data.

In some examples, the method further includes:
reading by the memory controller 40, based on a memory address in a read command, corresponding read data from the memory device; and
substituting by the memory controller 40, in the read data, the replacement binary code marked by the replacement identifier with a corresponding binary code to be replaced when the memory address has the corresponding replacement identifier.

In some examples, the number of states corresponding to the threshold voltage distribution Vt is reduced by modifying the data encoding mode of a randomizer encoder in the memory controller 40, which can reduce the reading disturbance, the programming disturbance, etc. while helping to reduce the programming duration of the memory device, and can also improve the data retention capability of the memory device to improve the reliability of the data. In addition, since the data retention capability is enhanced, and the stronger the data retention capability is, the less the periodic refresh cycle times of a firmware are, the erasing cycle overhead of the memory device can be reduced and the service life of the memory device can be prolonged.

The memory system may be integrated into various memory systems, for example, included in the same package (e.g., a universal flash storage (UFS) package or an embedded multimedia card (eMMC) package). That is, the memory system may be applied to and packaged in different electronic products, for example, at least one of a data server, a network-attached storage, an Internet of Things (IoT) device or a portable electronic device. The portable electronic device may include a mobile phone (e.g., a cell phone), a personal computer (PC), a desktop computer, a tablet computer, a notebook computer, a server, a vehicle-mounted device, a game console, a printer, a positioning device, a wearable device, a smart sensor, a mobile power supply, an enterprise digital assistant (EDA), a digital still camera, a digital video camera, an audio device, a portable multimedia player (PMP), a personal navigation device (PND), an MP3 player, a handheld game console, an e-book, a virtual reality (VR) device, an augmented reality (AR) device or any other appropriate electronic devices having memory devices therein.

Figure 12:
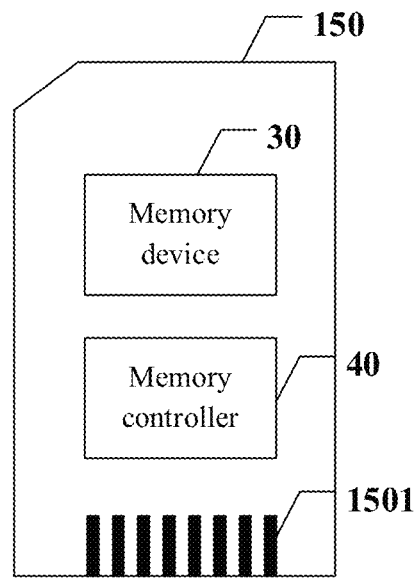
FIG. 12 shows a schematic diagram of an example memory device (e.g., a memory card) with a memory system according to some aspects provided by the present disclosure.

In some examples, as shown in FIG. 4, the memory system 100 includes a memory controller 40 and a memory device, and the memory system 100 may be integrated into a memory card device 150 as shown in FIG. 12.

The memory card device 150 includes any one of a PC (PCMCIA, Personal Computer Memory Card International Association) card, a compact flash (CF) card, a smart media (SM) card, a memory device rod, a multimedia card (MMC), a secure digital (SD) memory card and a UFS.

Figure 13:
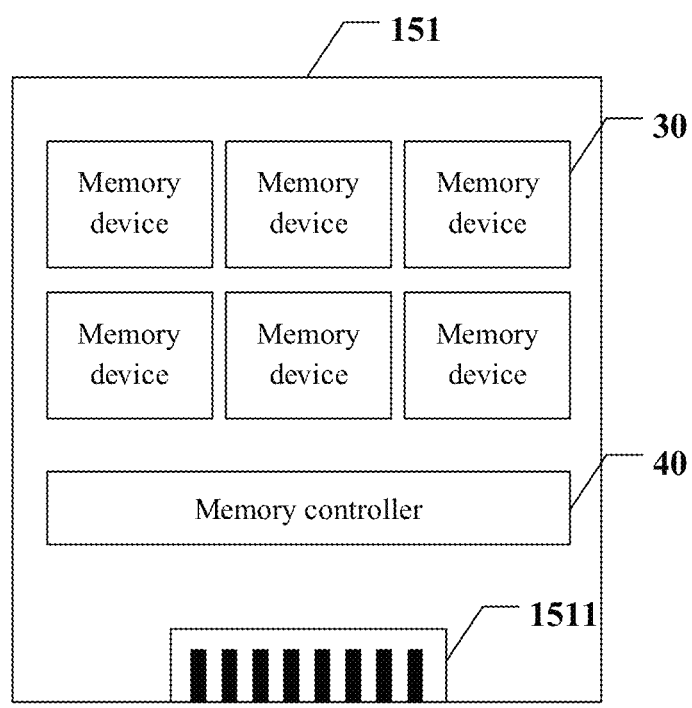
FIG. 13 shows a schematic diagram of an example solid-state drive (SSD) with a memory system according to some aspects of the present disclosure.

In some other examples, as shown in FIG. 4, the memory system 100 includes a memory controller 40 and a plurality of memory devices and is integrated into a solid state drive (SSD) as shown in FIG. 13.

Some examples also provide an electronic device. The electronic device may be any one of a mobile phone, a desktop computer, a tablet computer, a notebook computer, a server, a vehicle-mounted device, a wearable device (such as a smart watch, a smart bracelet and smart glasses), a mobile power supply, a game console, a digital multimedia player, etc.

In some examples, the quantity of states is reduced by modifying a data encoding mode of the memory controller to help shorten programming duration of the memory device and reduce disturbance, and a data retention capability of the memory device is improved to increase the data reliability. In addition, since the data retention capability is enhanced, and the stronger the data retention capability is, the less the periodic refresh cycle times of a firmware are, the erasing cycle overhead of the memory device can be reduced and the service life of the memory device can be prolonged.

The electronic device may include the memory system 100 described above, and may also include at least one of a central processing unit (CPU), a cache, etc. The electronic device may be a cell phone, a desktop computer, a laptop computer, a tablet computer, a vehicle computer, a game console, a printer, a positioning device, a wearable electronic device, a smart sensor, a virtual reality (VR) device, an augmented reality (AR) device, or any other appropriate electronic devices having memory devices therein. The electronic device may include a host and a memory system 100. The memory system 100 is provided with one or more memory devices 30 and memory controllers 40. The host may include a processor of the electronic device (for example, a CPU), or a system-on-chip (SoC) (for example, an application processor (AP)). The host may also include a memory interface for being coupled to the memory system 100, and the memory interface is configured to adhere to a corresponding protocol (such as NVMe and PCIe). The host may be configured to send data to or receive data from the memory device 30 via, for example, the memory interface. In order to send data to or receive data from the memory device 30, in addition to data, the host may also send an instruction to the memory system 100. The memory device 30 may be any of the memory devices disclosed by the present disclosure.

According to some examples, the memory controller 40 is coupled to the memory device 30 and the host, and configured to control the memory device 30. The memory controller 40 may be specifically implemented by a microprocessor, a micro-memory controller 40 (also known as a micro-memory controller unit (MCU)), a central processing unit (CPU), a digital signal processor (DSP), an application specific integrated circuit (ASIC), a field programmable gate array (FPGA), a programmable logic device (PLD), a state machine, a gated logic unit, a discrete hardware circuit or a combination thereof, as well as other appropriate hardware, firmware and/or software configured to perform various functions described in detail below. The memory controller 40 may manage the data stored in the memory device 30 and communicate with the host through its front-end interface. In some examples, the memory controller 40 is designed to operate in a low-duty-cycle environment, such as a secure digital (SD) card, a compact flash (CF) card, a universal serial bus (USB) flash drive, or other media for use in electronic devices such as a personal computer, a digital camera and a mobile phone. In some examples, the memory controller 40 is designed to operate in a high-duty-cycle environment, for example, an SSD or an embedded multi media card (eMMC), which is used as a data memory device for mobile devices such as a smart phone, a tablet computer and a laptop computer, as well as an enterprise memory array. The memory controller 40 may be configured to control operations of the memory device 30, such as reading, erasing and programming operations.

The memory controller 40 may also be configured to manage various functions related to data stored or to be stored in the memory device 30, including but not limited to bad block management, garbage collection, logical to programming address translation, wear leveling, and the like. In some examples, the memory controller 40 is configured to process an error correction code (ECC) related to data read from or written into the memory device 30. The memory controller 40 may also perform any other appropriate functions, for example, formatting the memory device 30. The memory controller 40 may communicate with an external device (e.g., a host) according to a specific communication protocol. For example, the memory controller 40 may communicate with an external device through at least one of various interface protocols, such as universal serial bus (USB) protocol, multimedia card (MMC) protocol, peripheral component interconnection (PCI) protocol, PCI-express (PCI-E) protocol, advanced technology attachment (ATA) protocol, serial ATA protocol, parallel ATA protocol, small computer small interface (SCSI) protocol, enhanced small disk interface (ESDI) protocol, integrated drive electronics (IDE) protocol and Firewire protocol.

The memory controller 40 and one or more memory devices 30 may be integrated into various memory systems, for example, included in the same package (for example, a universal flash storage (UFS) package or an eMMC package). That is, the memory system 100 may be implemented by and packaged into different terminal electronic products. In an example as shown in FIG. 12, the memory controller 40 and the single memory device 30 may be integrated into the memory card device 150. The memory card device 150 may include an internal memory device embedded into an electronic device. For example, the memory card device 150 may include a PC (PCMCIA, Personal Computer Memory Card International Association) card, a CF card, a smart media (SM) card, a memory device rod, a multimedia card (MMC, RS-MMC, MMC micro), a SD card (SD, mini SD, micro SD, SDHC), a UFS memory card, etc. The memory card device 150 may also include a memory device card connector 1501 configured to couple the memory card device 150 to the host. In another example as shown in FIG. 13, a memory controller 40 and a plurality of memory devices 30 may be integrated into a solid state disk (SSD) 151. The SSD 151 may also include an SSD connector 1511 configured to couple the SSD151 to the host. In some examples, the storage capacity and/or operation speed of the SSD151 is greater than those of the memory card device 150.

Examples provide a memory controller, a memory device, a memory system and an operation method thereof, which can shorten programming duration of the memory device and reduce disturbance, and improve a data retention capability of the memory device to increase the data reliability.

In a first example, a memory controller is provided to control a memory device, the memory device comprising at least one memory cell which provides at most $2^N$ programming levels for storing N bits of data, wherein N being a positive integer, and the memory controller is configured to: find, in input data, a binary code to be replaced corresponding to a preset programming level to be replaced, wherein the input data is to be written into the memory cell; and substitute the binary code to be replaced in the input data with a replacement binary code corresponding to a preset replacement programming level, and generate a replacement identifier linking a memory address corresponding to the replacement binary code.

In some examples, the memory controller is configured to: compare the input data with the binary code to be replaced; and determine that the preset programming level to be replaced is present in the input data if the binary code to be replaced is present in the input data.

In some examples, the memory controller is configured to store the replacement identifier, and a replacing relationship between the binary code to be replaced and the replacement binary code marked by the replacement identifier.

In some examples, the memory controller is configured to: set one programming level of the $2^N$ programming levels as a preset programming level to be replaced, and a binary code corresponding to the preset programming level to be replaced as the binary code to be replaced; and set another programming level of the $2^N$ programming levels as a preset replacement programming level, and a binary code corresponding to the preset replacement programming level as the replacement binary code.

In some examples, the memory controller is configured to: set at least two programming levels of the $2^N$ programming levels as preset programming levels to be replaced, and binary codes corresponding to the preset programming levels to be replaced as binary codes to be replaced; and set at least two other programming levels of the $2^N$ programming levels as preset replacement programming levels, and binary codes corresponding to the preset replacement programming levels as replacement binary codes.

In some examples, the preset programming levels to be replaced are M programming levels with a longest programming duration among all programming levels, and the preset replacement programming levels are M programming levels with a shortest programming duration among all the programming levels, wherein M<N, and M and N being positive integers.

In some examples, the preset programming levels to be replaced are M programming levels with a poorest data retention capability among all programming levels, and the preset replacement programming levels are M programming levels with a strongest data retention capability among all the programming levels, wherein M<N, and M and N being positive integers.

In some examples, the preset programming levels to be replaced are M programming levels with a worst disturbance suppression state among all programming levels, and the preset replacement programming levels are M programming levels with a best disturbance suppression state among all the programming levels, wherein M<N, and M and N being positive integers.

In some examples, the replacement identifier is a binary number.

In some examples, the binary code to be replaced differs from the replacement binary code by one bit.

In some examples, the memory controller is configured to: read corresponding read data from the memory device based on a memory address in a read command; and substitute the replacement binary code marked by the replacement identifier in the read data with a corresponding binary code to be replaced when the memory address has the corresponding replacement identifier.

In a second example, a memory system is provided which includes: a memory device, wherein the memory device comprises at least one memory cell which provides at most $2^N$ programming levels for storing N bits of data, wherein N being a positive integer; and a memory controller used to control the memory device, wherein the memory controller is configured to: find, in input data, a binary code to be replaced corresponding to a preset programming level to be replaced, wherein the input data is to be written into the memory cell; and substitute the binary code to be replaced in the input data with a replacement binary code corresponding to a preset replacement programming level, and generate a replacement identifier linking a memory address corresponding to the replacement binary code.

In a third example, a memory device comprises at least one memory cell which provides at most $2^N$ programming levels for storing N bits of data, wherein N being a positive integer, and the memory device is configured to: receive a replacement binary code transmitted by a memory controller, wherein the replacement binary code being used by the memory controller to substitute a binary code to be replaced with a binary code corresponding to a preset replacement programming level when the binary code to be replaced corresponding to a preset programming level to be replaced is found in input data, wherein the input data is to be written into the memory cell; and perform programming on the memory cell based on the replacement binary code transmitted by the memory controller to store the input data.

In some examples, the memory device is configured to: store a replacement identifier, and a replacing relationship between the binary code to be replaced and the replacement binary code marked by the replacement identifier, wherein the replacement identifier being a flag generated by the memory controller and links a corresponding memory address of the replacement binary code.

In some examples, the programming level of the memory cell is less than $2^N$.

In a fourth example, a method of operation of a memory system is provided for a memory device and a memory controller for controlling the memory device, wherein the memory device includes at least one memory cell which provides at most $2^N$ programming levels for storing N bits of data, wherein N is a positive integer, and the operation method comprises: finding, by the memory controller and in input data, a binary code to be replaced corresponding to a preset programming level to be replaced, wherein the input data is to be written into the memory cell; substituting, by the memory controller, the binary code to be replaced in the data to be stored with a replacement binary code corresponding to a preset replacement programming level, and generate a replacement identifier linking a memory address corresponding to the replacement binary code; and receiving, by the memory device, the replacement binary code transmitted by the memory controller, and performing programming on the memory cell based on the replacement binary code transmitted by the memory controller to store the input data.

In some examples, the method further includes: reading, by the memory controller, corresponding read data from the memory device based on a memory address in a read command; and substituting, by the memory controller, the replacement binary code marked by the replacement identifier in the read data with a corresponding binary code to be replaced when the memory address has the corresponding replacement identifier.

At least some of the example memory controllers, the memory devices, the memory systems and the operation methods provided above have one or more of the following beneficial effects. The quantity of states corresponding to threshold voltage distribution Vt is reduced by modifying a data encoding mode of a Randomizer Encoder in the memory controller, which can help shorten the programming duration of the memory device, and reduce the reading disturbance, programming disturbance and the like. Moreover, the data retention capability of the memory device is further improved to increase the data reliability. In addition, since the data retention capability is enhanced, and the stronger the data retention capability is, the less the periodic refresh cycle times of a firmware are, the erasing cycle overhead of the memory device can be reduced and the service life of the memory device can be prolonged.

Example implementations are described in detail above. Principles disclosed herein are illustrated by the specific examples in the present disclosure. The descriptions of the above examples are only for helping to understand the disclosure of this patent. Modifications in the specific implementations described herein are contemplated and will fall within the skill of those of ordinary skill in the art without departing from the scope or spirit of this patent. Moreover, the content of the above description should not be construed as a limitation to the appended claims.

What is claimed is:

1. A memory controller for use with a memory device including at least one memory cell which provides at most $2^N$ programming levels to store N bits of data, wherein N is a positive integer, and the memory controller comprises:
   interface circuitry to receive input data to be written into the at least one memory cell; and
   control circuitry to:
      find, in the input data, a binary code to be replaced, the binary code to be replaced corresponding to a preset programming level to be replaced;
      substitute the binary code to be replaced in the input data with a replacement binary code corresponding to a preset replacement programming level, wherein the binary code to be replaced differs from the replacement binary code by one bit; and
      generate a replacement identifier to link a memory address to the replacement binary code.

2. The memory controller according to claim 1, wherein the memory controller is to determine that the preset programming level to be replaced is present in the input data if the binary code to be replaced is present in the input data.

3. The memory controller according to claim 1, wherein the memory controller is to store the replacement identifier, and a replacing relationship between the binary code to be replaced and the replacement binary code marked by the replacement identifier.

4. The memory controller according to claim 1, wherein the memory controller is to:
   set one programming level of the $2^N$ programming levels as the preset programming level to be replaced, and a binary code corresponding to the preset programming level to be replaced as the binary code to be replaced; and
   set another programming level of the $2^N$ programming levels as the preset replacement programming level, and a binary code corresponding to the preset replacement programming level as the replacement binary code.

5. The memory controller according to claim 1, wherein the memory controller is to:
   set at least two programming levels of the $2^N$ programming levels as preset programming levels to be replaced, and binary codes corresponding to the preset programming levels to be replaced as binary codes to be replaced; and
   set at least two other programming levels of the $2^N$ programming levels as preset replacement programming levels, and binary codes corresponding to the preset replacement programming levels as replacement binary codes.

6. The memory controller according to claim 5, wherein the preset programming levels to be replaced are M programming levels each having a programming duration in a first subset of programming durations among all $2^N$ programming levels, and the preset replacement programming levels are M programming levels each having a programming duration in a second subset of programming durations among all the $2^N$ programming levels, wherein M<N, and M and N are positive integers, and wherein the second subset of programming durations are respectively shorter than the first subset of programming durations.

7. The memory controller according to claim 5, wherein the preset programming levels to be replaced are M programming levels each having a data retention capability in a first subset of data retention capabilities among all $2^N$ programming levels, and the preset replacement programming levels are M programming levels each having a data retention capability in a second subset of data retention capabilities among all the $2^N$ programming levels, wherein M<N, and M and N are positive integers, and wherein the first subset of data retention capabilities are poorer than the second subset of data retention capabilities.

8. The memory controller according to claim 5, wherein the preset programming levels to be replaced are M programming levels each having a disturbance suppression state in a first subset of disturbance suppression states among all $2^N$ programming levels, and the preset replacement programming levels are M programming levels each having a disturbance suppression state in a second subset of disturbance suppression states among all the $2^N$ programming levels, wherein M<N, and M and N are positive integers, and wherein the first subset of disturbance suppression states are worse than the second subset of disturbance suppression states.

9. The memory controller according to claim 1, wherein the replacement identifier is a binary number.

10. The memory controller according to claim 1, wherein the memory controller is to:
    read corresponding read data from the memory device based on a memory address in a read command; and substitute in the read data the replacement binary code with the binary code to be replaced when the memory address in the read command has been linked to the replacement identifier.

11. A memory system, comprising:
a memory device, wherein the memory device includes at least one memory cell which provides at most $2^N$ programming levels for storing N bits of data, wherein N is a positive integer; and
a memory controller coupled to the memory device, wherein the memory controller is to:
find, in data to be stored, a binary code to be replaced corresponding to a preset programming level to be replaced, wherein the data to be stored is data to be written into the memory cell;
substitute the binary code to be replaced in the data to be stored with a replacement binary code corresponding to a preset replacement programming level, wherein the binary code to be replaced differs from the replacement binary code by one bit; and
generate a replacement identifier linking a memory address corresponding to the replacement binary code.

12. The memory system according to claim 11, wherein the memory controller is to determine that the preset programming level to be replaced is present in the data to be stored if the binary code to be replaced is present in the data to be stored.

13. The memory controller according to claim 11, wherein the memory controller is to:
set one or more programming levels of the $2^N$ programming levels as one or more preset programming levels to be replaced, and a binary code corresponding to the one or more preset programming levels to be replaced as the binary code to be replaced; and
set another one or more programming levels of the $2^N$ programming levels as one or more preset replacement programming levels, and a binary code corresponding to the one or more preset replacement programming levels as the replacement binary code.

14. The memory controller according to claim 13, wherein the one or more preset programming levels to be replaced are M programming levels each having a programming duration in a first subset of programing durations among all $2^N$ programming levels, and the one or more preset replacement programming levels are M programming levels each having a programming duration in a second subset of programming durations among all the $2^N$ programming levels, wherein M<N, and M and N are positive integers, and wherein the second subset of programming durations are shorter than the first subset of programming durations.

15. The memory controller according to claim 13, wherein the one or more preset programming levels to be replaced are M programming levels each having a data retention capability in a first subset of data retention capabilities among all $2^N$ programming levels, and the one or more preset replacement programming levels are M programming levels each having a data retention capability in a second subset of data retention capabilities among all the $2^N$ programming levels, wherein M<N, and M and N are positive integers, and wherein the first subset of data retention capabilities are poorer than the second subset of data retention capabilities.

16. The memory controller according to claim 13, wherein the n or more preset programming levels to be replaced are M programming levels each having a disturbance suppression state in a first subset of disturbance suppression states among all $2^N$ programming levels, and the one or more preset replacement programming levels are M programming levels each having a disturbance suppression state in a second subset of disturbance suppression states among all the $2^N$ programming levels, wherein M<N, and M and N are positive integers, and wherein the first subset of disturbance suppression states are worse than the second subset of disturbance suppression states.

17. A memory device comprising at least one memory cell which provides at most $2^N$ programming levels to store N bits of data, N is a positive integer, and the memory device is to:
receive a replacement binary code transmitted by a memory controller, the replacement binary code corresponds to a preset replacement programming level and is used to substitute a binary code to be replaced found in the data to be stored when the binary code to be replaced corresponds to a preset programming level to be replaced, wherein the data to be stored is data to be written into the memory cell, and wherein the binary code to be replaced differs from the replacement binary code by one bit; and
perform programming on the memory cell based on the replacement binary code transmitted by the memory controller to store the data to be stored.

18. The memory device according to claim 17, wherein the memory device is to store a replacement identifier, and a replacing relationship between the binary code to be replaced and the replacement binary code marked by the replacement identifier, the replacement identifier is a flag generated by the memory controller and links a corresponding memory address to the replacing relationship.

19. The memory device according to claim 17, wherein a number of programming levels of the memory cell is less than $2^N$.

* * * * *

UNITED STATES PATENT AND TRADEMARK OFFICE
CERTIFICATE OF CORRECTION

PATENT NO. : 12,327,026 B2
APPLICATION NO. : 18/148859
DATED : June 10, 2025
INVENTOR(S) : Huang et al.

Page 1 of 1

It is certified that error appears in the above-identified patent and that said Letters Patent is hereby corrected as shown below:

In the Claims

In Column 26, Claim 16, Line 14, delete "n" and insert --one--.

Signed and Sealed this
Twenty-sixth Day of August, 2025

Coke Morgan Stewart
*Acting Director of the United States Patent and Trademark Office*